(12) United States Patent
Chen et al.

(10) Patent No.: US 9,773,534 B2
(45) Date of Patent: Sep. 26, 2017

(54) NON-VOLATILE MEMORY ACCELERATOR AND METHOD FOR SPEEDING UP DATA ACCESS

(71) Applicant: Faraday Technology Corp., Hsinchu (TW)

(72) Inventors: Kun-Chih Chen, Hsinchu (TW); Hsiao-An Chuang, Hsinchu (TW)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 15/158,589

(22) Filed: May 19, 2016

(65) Prior Publication Data

US 2017/0221535 A1    Aug. 3, 2017

(30) Foreign Application Priority Data

Jan. 29, 2016  (TW) .............................. 105102822 A

(51) Int. Cl.
*G11C 7/10* (2006.01)
*G11C 7/22* (2006.01)
*G11C 8/06* (2006.01)

(52) U.S. Cl.
CPC . *G11C 7/22* (2013.01); *G11C 8/06* (2013.01)

(58) Field of Classification Search
CPC .................................... G11C 7/22; G11C 8/06
USPC ........................................ 365/189.02, 189.17
See application file for complete search history.

(56) References Cited

U.S. PATENT DOCUMENTS

| | | | |
|---|---|---|---|
| 6,321,325 B1 * | 11/2001 | Tremblay | G06F 9/3802 712/204 |
| 9,122,611 B2 | 9/2015 | Yeh | |
| 2009/0300294 A1 * | 12/2009 | Moyer | G06F 9/3824 711/144 |

\* cited by examiner

*Primary Examiner* — Anthan Tran
(74) *Attorney, Agent, or Firm* — Winston Hsu

(57) ABSTRACT

A non-volatile memory accelerator and a method for speeding up data access are provided. The non-volatile memory accelerator includes a data pre-fetching unit, a cache unit, and an access interface circuit. The data pre-fetching unit has a plurality of line buffers. One of the line buffers provides read data according to a read command, or the data pre-fetching unit reads at least one cache data as the read data according to the read command. The data pre-fetching unit further stores in at least one of the line buffers a plurality of pre-stored data with continuous addresses according to the read command. The cache unit stores the at least one cache data and the pre-stored data with the continuous addresses. The access interface circuit is configured to be an interface circuit of the non-volatile memory.

11 Claims, 5 Drawing Sheets

# NON-VOLATILE MEMORY ACCELERATOR AND METHOD FOR SPEEDING UP DATA ACCESS

CROSS-REFERENCE TO RELATED APPLICATION

This application claims the priority benefit of Taiwan application serial no. 105102822, filed on Jan. 29, 2016. The entirety of the above-mentioned patent application is hereby incorporated by reference herein and made a part of this specification.

FIELD OF INVENTION

The invention relates to a non-volatile memory accelerator and a method for speeding up data access; more particularly, the invention relates to a multi-level non-volatile memory accelerator and a method for speeding up data access to the multi-level non-volatile memory.

DESCRIPTION OF RELATED ART

To provide an effective data memory medium that can function for a long period of time, the non-volatile memory has become an indispensible memory device in an electronic apparatus. In response to the increasing requirements for performance of the electronic apparatus, how to rapidly read the required data from the non-volatile memory has become one of the important issues to be resolved.

SUMMARY OF THE INVENTION

The invention provides a non-volatile memory accelerator and a method for speeding up data access, so as to effectively improve the efficiency of reading data from a non-volatile memory.

In an embodiment of the invention, the non-volatile memory accelerator includes a data pre-fetching unit, a cache unit, and an access interface circuit. The data pre-fetching unit has a plurality of line buffers. One of the line buffers provides read data according to a read command, or the data pre-fetching unit reads at least one cache data as the read data according to the read command. The data pre-fetching unit further stores in at least one of the line buffers a plurality of pre-stored data with continuous addresses according to the read command. The cache unit is coupled to the data pre-fetching unit and configured to store the at least one cache data and the pre-stored data with the continuous addresses. The data pre-fetching unit stores in at least one of the line buffers the pre-stored data with the continuous addresses according to the read command. The access interface circuit is coupled to the data pre-fetching unit, the cache unit, and a non-volatile memory, and the access interface circuit acts as an interface circuit of the non-volatile memory.

In an embodiment of the invention, a method for speeding up data access to a non-volatile memory includes: providing a plurality of line buffers, providing read data according to a read command by one of the line buffers, and storing in at least one of the line buffers a plurality of pre-stored data with continuous addresses according to the read command; providing a cache unit to store at least one cache data and the pre-stored data with the continuous addresses and providing the at least one cache data as the read data according to the read command.

Based on the above, the line buffers and the cache unit are provided, such that the resultant non-volatile memory has the three-layer data access structure. The data with the continuous addresses are provided by the line buffers, and the data with hop addresses are provided by the cache unit, so as to effectively improve the efficiency of accessing data in the non-volatile memory.

Several exemplary embodiments accompanied with figures are described in detail below to further describe the disclosure in details.

DETAILED DESCRIPTION OF DISCLOSED EMBODIMENTS

Figure 1:
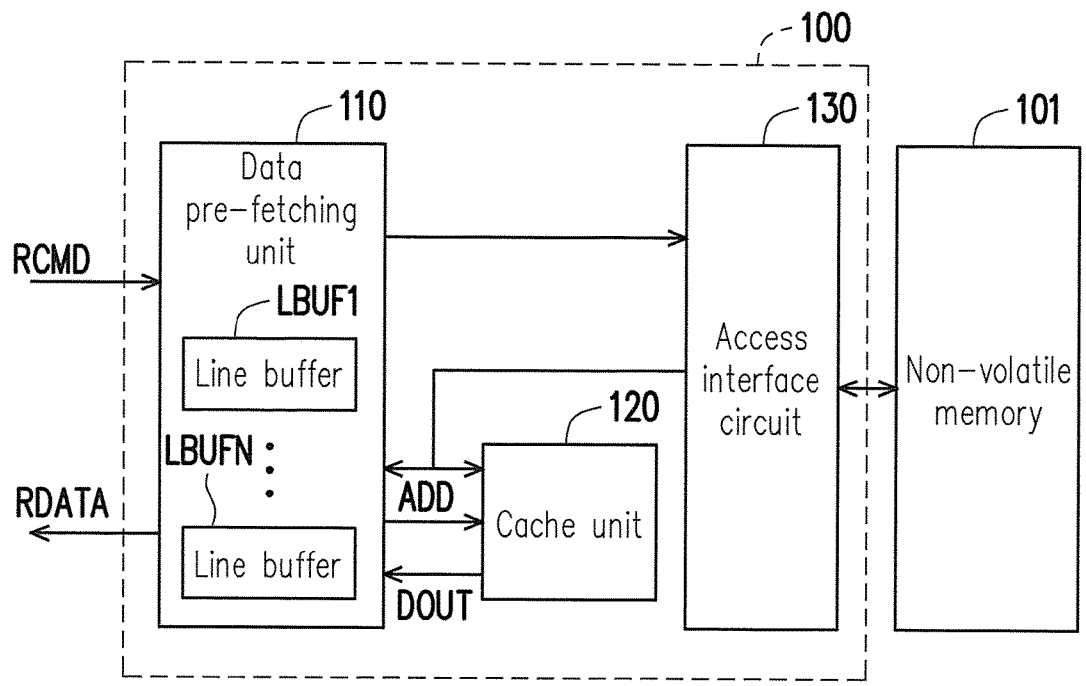
FIG. 1 is a schematic view of a non-volatile memory accelerator according to an embodiment of the invention.

Please refer to FIG. 1, which is a schematic view of a non-volatile memory accelerator according to an embodiment of the invention. The non-volatile memory accelerator 100 is coupled to a non-volatile memory 101 and is configured to accelerate the data reading action performed on the non-volatile memory 101. The non-volatile memory accelerator 100 includes a data pre-fetching unit 110, a cache unit 120, and an access interface circuit 130. The data pre-fetching unit 110 has a plurality of line buffers LBUF1-LBUFN. The data pre-fetching unit 110 can receive an external read command RCMD, and one of the line buffers LBUF1-LBUFN of the data pre-fetching unit 110 provides read data RDATA according to the read command RCMD. The data pre-fetching unit 110 can also store a plurality of pre-stored data in at least one of the line buffers LBUF1-LBUFN according to the read command RCMD. The pre-stored data stored in the line buffers LBUF1-LBUFN may be pre-stored data with continuous addresses. Here, the pre-stored data with the continuous addresses refer to a plurality of data retrieved from an external central processor of the non-volatile memory accelerator 100, i.e., the data that have continuous addresses and are stored in the non-volatile memory 101. Alternatively, the data pre-fetching unit 110 reads at least one cache data DOUT according to the read command. The cache data DOUT may have hop addresses or continuous addresses. The data with the hop addresses refer to data that are retrieved from an external central processor of the non-volatile memory accelerator 100, and the address of the retrieved data and the address of the previous data are not continuous, i.e., the data that have non-continuous addresses and are stored in the non-volatile memory 101.

The cache unit 120 is coupled to the data pre-fetching unit 110. The cache unit 120 can be configured to store one or more cache data. The access interface circuit 130 is coupled to the data pre-fetching unit 110, the cache unit 120, and the non-volatile memory 101. The access interface circuit 130 is configured to perform actions required by data access to the non-volatile memory 101 and thus serves as the interface for accessing the non-volatile memory 101.

Note that the data storage capacity of the line buffers LBUF1-LBUFN is less than the data storage capacity of the cache unit 120.

As to details of the actions performed by the non-volatile memory accelerator 100, the data pre-fetching unit 110 can receive the read command RCMD sent by an external electronic apparatus (e.g., a processor). Besides, the data pre-fetching unit 110 can first search the line buffers LBUF1-LBUFN to learn whether the required data corresponding to the read command RCMD are already stored in one of the line buffers LBUF1-LBUFN. If any of the line buffers LBUF1-LBUFN (e.g., the line buffer LBUF1) is found to include the pre-stored required data, the data pre-fetching unit 110 can output the required data stored as the read data RDATA by using the line buffer LBUF1 and provide the read data RDATA to the external electronic apparatus.

Note that each of the line buffers LBUF1-LBUFN provided in the present embodiment can store a plurality of pre-stored data with the continuous addresses. Hence, if the data required by the external electronic apparatus are the data with the continuous addresses, one of the line buffers can perform continuous reading actions to rapidly obtain the required data.

On the contrary, if none of the line buffers LBUF1-LBUFN is found to have the pre-stored required data, the data pre-fetching unit 110 searches whether the cache unit 120 includes the required data. If the data pre-fetching unit 110 finds out that the cache unit 120 stores the required data corresponding to the read command RCMD, the cache data DOUT as the required data in the cache unit 120 are read out, and the read required data are deemed as the read data RDATA and are transmitted to the external electronic apparatus. In another aspect, the data pre-fetching unit 110 can also store the cache data DOUT read from the cache unit 120 to the idle line buffer of the line buffers LBUF1-LBUFN.

When the data pre-fetching unit 110 stores the cache data DOUT into one of the line buffers (e.g., the line buffer LBUF1), the data pre-fetching unit 110 can further read from the non-volatile memory 101 one or more data of which the addresses and the address of the cache data DOUT are continuous, and the data pre-fetching unit 110 stores the one or more data into the line buffer LBUF1 and the cache unit 120. Thereby, when the external electronic apparatus is going to read the required data of which the addresses and the address of the cache data DOUT are continuous, the data pre-fetching unit 110 can rapidly provide the external electronic apparatus with the read data RDATA from the line buffer LBUF1 in a rapid manner, so as to enhance the efficiency of reading data.

According to the present embodiment, the cache unit 120 can store one or more cache data. The cache data may have hop addresses and continuous addresses. That is to say, the addresses of the cache data in the cache unit 120 may be continuous or not continuous.

Besides, in terms of searching data in the cache unit 120, the cache unit 120 may be a tag memory, and the data pre-fetching unit 110 can transmit the memory address ADD of the required data to the cache unit 120. The cache unit 120 can then determine whether the data with the memory address ADD are stored in the cache unit 120 and thereby transmit the search result of "hit" or "miss". If the search result is "hit", the cache unit 120 can read the cache data DOUT corresponding to the memory address ADD.

By contrast, if the search result is "miss", it indicates that the required data corresponding to the read command RCMD are not stored in the cache unit 120. At this time, the data pre-fetching unit 110 can read the required data from the non-volatile memory 101 through the access interface circuit 130, and the required data read from the non-volatile memory 101 are deemed as the read data RDATA and provided to the external electronic apparatus.

It should be mentioned that the required data read from the non-volatile memory 101 can be updated to the cache unit 120 and the idle line buffer of the line buffers LBUF1-LBUFN in response to subsequent reading actions performed by the external electronic apparatus.

Besides, the cache unit 120 can be built by a simplified cache memory, and the cache unit 120 provided in the present embodiment of the invention is merely required to perform data reading, writing, and searching functions.

Figure 2:
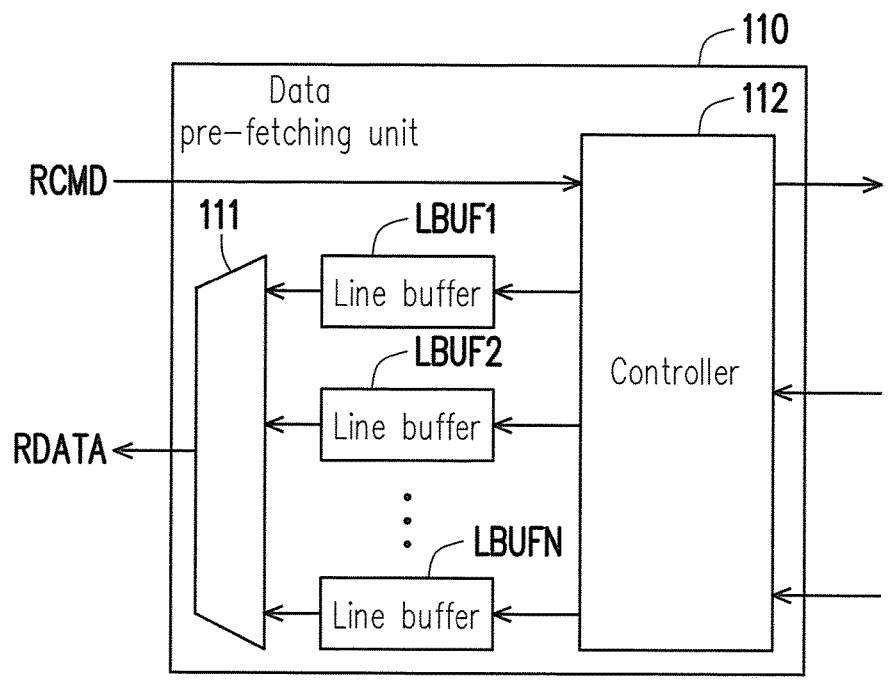
FIG. 2 is a schematic view showing an implementation of a data pre-fetching unit 110 according to an embodiment of the invention.

FIG. 2 is a schematic view showing an implementation of a data pre-fetching unit 110 according to an embodiment of the invention. The data pre-fetching unit 110 includes a multiplexer 111, line buffers LBUF1-LBUFN, and a controller 112. An input end of the multiplexer 111 is coupled to output ends of the line buffers LBUF1-LBUFN, and an output end of the multiplexer 111 generates the read data RDATA. The multiplexer 111 selects data of one of the line buffers LBUF1-LBUFN as the read data RDATA and outputs the read data RDATA. Input ends of the line buffers LBUF1-LBUFN are coupled to the controller 112. The controller 112 is directly or indirectly coupled to an external electronic apparatus (not shown) and receives the read data RCMD transmitted by the external electronic apparatus.

In the present embodiment, the controller 112 can search data from the line buffers according to the read command RCMD and determines the multiplexer 111 to select the read data in one of the line buffers LBUF1-LBUFN for outputting. If the line buffers do not include any required data, the controller 112 enables the cache unit 120 to perform the data searching function; if the cache unit 120 does not include any required data as well, the controller 112 may also read the required data from the non-volatile memory 101 through the access interface circuit 130.

Additionally, the controller 112 can update the required data read from the non-volatile memory 101 to the line buffers LBUF1-LBUFN and the cache unit 120. The controller 112 can first determine whether there is any idle line buffer among the line buffers LBUF1-LBUFN and update and store the required data into the idle line buffer.

In the present embodiment, each of the line buffers LBUF1-LBUFN can store 128 bits of data, and each data can be counted by word count of the data. Certainly, it is possible that the number of bits of the data stored in each of the line buffers LBUF1-LBUFN is not 128. Each of the line buffers (e.g., the line buffer LBUF1) stores the address corresponding to the non-volatile memory and the pre-stored data that correspond to the stored address and are read from the non-volatile memory; in addition, the line buffer LBUF1 further stores an effective flag. The effective flag is configured to indicate whether data in the line buffer LBUF1 can be provided and read. For instance, when the non-volatile memory is being erased, the effective flag of the line buffer LBUF1 is set as "0". At this time, since the pre-stored data in the line buffer LBUF1 may not be the data of the non-volatile memory, setting the effective flag as "0" may prevent the old pre-stored data in the line buffer LBUF1 from being read out and thus generating errors. By contrast, if new data are updated and stored into the line buffer LBUF1, the effective flag of the line buffer LBUF1 may be correspondingly updated to "1".

Figure 3:
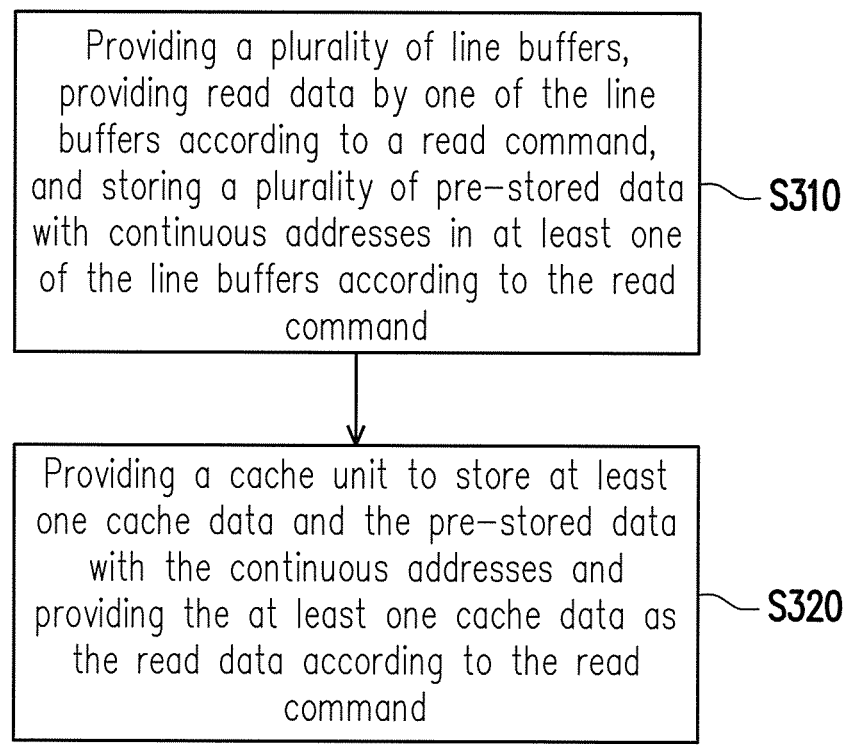
FIG. 3 is a flow chart of a method for speeding up data access to a non-volatile memory according to an embodiment of the invention.

FIG. 3 is a flow chart of a method for speeding up data access to a non-volatile memory according to an embodiment of the invention. In step S310, plural line buffers are provided, read data is provided by one of the line buffers according to a read command, and plural pre-stored data with continuous addresses are stored in at least one of the line buffers according to the read command. In step S320, a cache unit is provided to store at least one cache data and the pre-stored data with the continuous addresses, and the at least one cache data is provided as the read data according to the read command.

Figure 4:
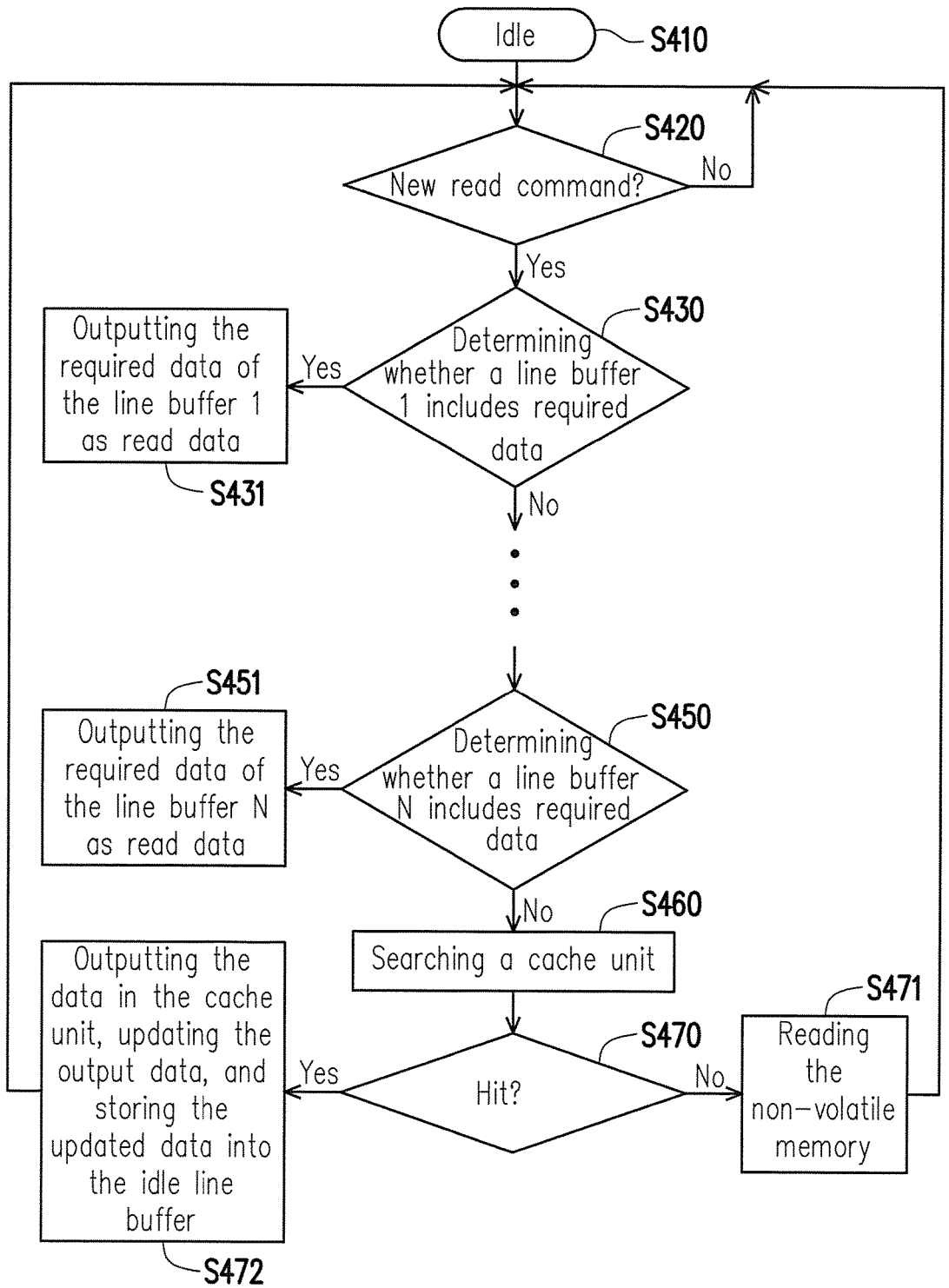
FIG. 4 to FIG. 6 respectively illustrate implementation details of different steps in a method for speeding up data access to a non-volatile memory according to an embodiment of the invention.
Figure 5:
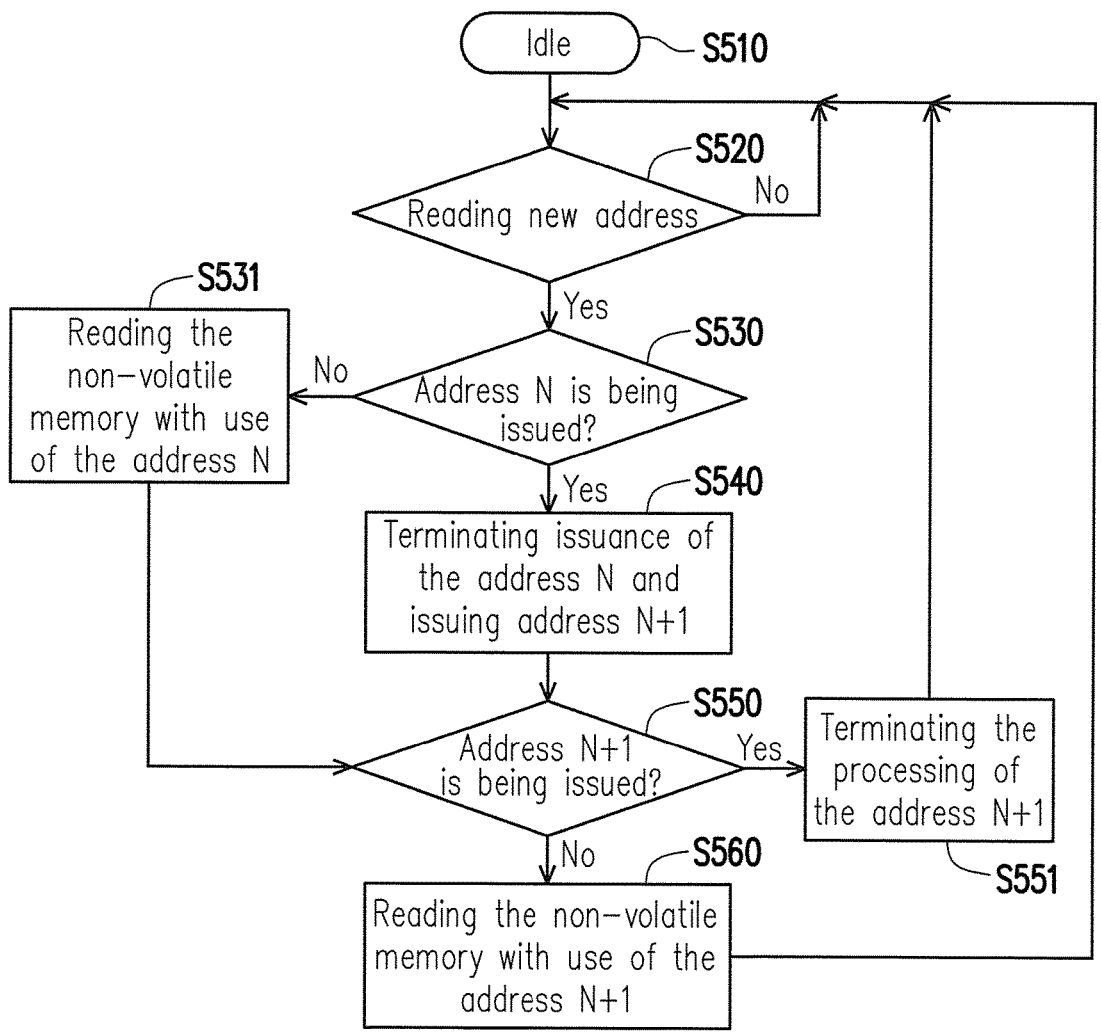
Figure 6:
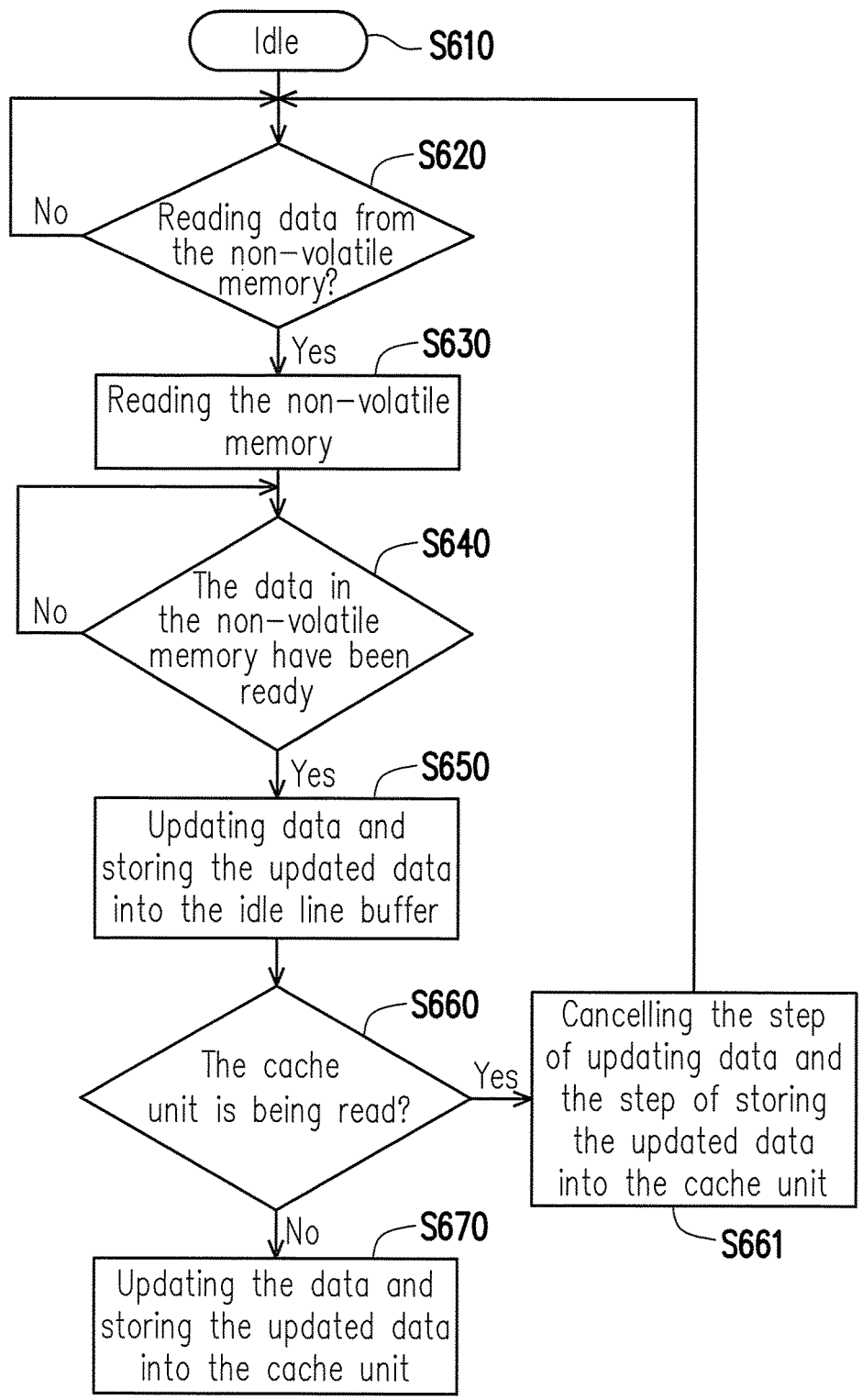

FIG. 4 to FIG. 6 respectively illustrate implementation details of different steps in a method for speeding up data access to a non-volatile memory according to an embodiment of the invention. With reference to FIG. 4, which depicts the data output process, step S410 shows an idle state. In step S420, it is determined whether a new read command is received or not; if not, step S420 is continuously performed. However, if the new read command is received, steps S430-S450 are performed in order. In steps S430-S450, the data in the line buffers 1–N are sequentially searched; if the required data are found in any of the corresponding line buffers 1–N, the data found in the corresponding line buffer are output as the read data (steps S431-S451). By contrast, if no required data can be found in the line buffers 1–N in steps S430-S450, step S460 is performed.

In step S460, the data searching process is performed on the cache unit; in step S470, whether the search result is "hit" or "miss" (not hit) is determined. If the search result is determined to be "hit" in step S470, step S472 is performed to output the data in the cache unit, and the data in the cache unit is updated and stored in the idle line buffer. By contrast, if the search result is determined to be "miss" in step S470, step S471 is performed to read the non-volatile flash memory to obtain the required data.

FIG. 5 illustrates an address issuing process. Step S510 shows an idle state. In step S520, it is determined whether a new read command is required to be issued or not; if not, step S520 is continuously performed. However, if it is determined that the new read command is required to be issued, step S530 is performed. In step S530, it is determined whether the address N of the non-volatile memory is issued or not; if not, the address N of the non-volatile memory is read in step S531, and then step S550 is performed. If it is determined that the address N is issued, step S540 is performed to terminate the issuance of the address N of the non-volatile memory, and the address N+1 is then issued. Step S550 is performed to determine whether the address N+1 is being issued; if yes, the processing of the address N+1 is terminated in step S551, and step S520 is again performed. However, if it is determined that the address N+1 is not being issued, step S560 is performed to read the non-volatile memory by using the address N+1.

FIG. 6 shows the data reading process. Step S610 shows an idle state. In step S620, it is determined whether the data are read from the non-volatile memory; if not, step S620 is continuously performed. By contrast, if it is determined that the data are read from the non-volatile memory, step S630 is performed. In step S630, the non-volatile memory is read. In step S640, it is determined whether the data read from the non-volatile memory are ready. If not, step S640 is continuously performed; as long as the data read from the non-volatile memory are determined to be ready in step S640, step S650 is performed to update the data read from the non-volatile memory and store the updated data into the idle line buffer. In step S660, whether the cache unit is read or not is determined, i.e., whether any other user searches the cache unit or not is determined; if not, step S670 is performed to update the data read from the non-volatile memory and store the updated data into the cache unit. By contrast, if it is determined that the cache unit has been searched in step S660, the step of updating the data and storing the updated data into the cache unit is cancelled (step S661), and step S620 is performed.

To sum up, plural line buffers and the cache unit are provided in the invention, whereby the pre-stored data with the continuous address and the cache data with the hop addresses are respectively stored in the line buffers and the cache unit. If the read data is required, the required data can be rapidly provided through the two-layer structure composed of the line buffers and the cache unit, so as to effectively enhance the reading efficiency of the non-volatile memory.

Although the disclosure has been provided with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. A non-volatile memory accelerator comprising:
   a data pre-fetching unit having a plurality of line buffers, one of the line buffers providing read data according to a read command, or the data pre-fetching unit reading at least one cache data as the read data according to the read command, the data pre-fetching unit further storing in at least one of the line buffers a plurality of pre-stored data with continuous addresses according to the read command;
   a cache unit coupled to the data pre-fetching unit and configured to store the at least one cache data and the pre-stored data with the continuous addresses; and
   an access interface circuit coupled to the data pre-fetching unit, the cache unit, and a non-volatile memory, the access interface circuit acting as an interface circuit of the non-volatile memory,
   wherein the data pre-fetching unit searches data stored in the line buffers according to the read command, if the line buffers include required data corresponding to the read command, the required data stored in one of the line buffers is provided as the read data, if the line buffers do not include the required data corresponding to the read command, the data pre-fetching unit searches whether the cache unit includes the required data, and if the cache unit includes the required data, the data pre-fetching unit reads the required data stored in the cache unit as the read data.

2. The non-volatile memory accelerator of claim 1, wherein the data pre-fetching unit further comprises:
   a multiplexer coupled to the line buffers, the multiplexer selecting one of the line buffers to provide the read data according to a control command; and
   a controller receiving the read command and generating the control command according to the read command, the non-volatile memory reading the pre-stored data, or the catch unit reading the at least one catch data according to the read command.

3. The non-volatile memory accelerator of claim 1, wherein if the cache unit does not include the required data, the data pre-fetching unit reads the required data from the non-volatile memory through the access interface circuit.

4. The non-volatile memory accelerator of claim 3, wherein the data pre-fetching unit further stores the required data into the cache unit and one of the line buffers.

5. The non-volatile memory accelerator of claim 3, wherein if the cache unit is being read, the data pre-fetching unit stores the required data into one of the line buffers.

6. The non-volatile memory accelerator of claim 1, wherein each of the line buffers stores an effective flag configured to indicate whether data in a corresponding line buffer of the line buffers is readable.

7. A method for speeding up data access to a non-volatile memory, the method comprising:
   providing a plurality of line buffers, providing read data according to a read command by one of the line buffers, and storing in at least one of the line buffers a plurality of pre-stored data with continuous addresses according to the read command; and
   providing a cache unit to store at least one cache data and the pre-stored data with the continuous addresses and providing the at least one cache data as the read data according to the read command, wherein if the line buffers do not include the required data corresponding to the read command, searching whether the cache unit includes the required data, and if the cache unit includes the required data, reading the required data stored in the cache unit as the read data.

8. The method of claim 7, wherein the step of providing the line buffers and providing the read data according to the read command by one of the line buffers comprises:
   searching data stored in the line buffers according to the read command, wherein if the line buffers include required data corresponding to the read command, the required data stored in one of the line buffers is provided as the read data.

9. The method of claim 7, further comprising storing the required data into the cache unit and one of the line buffers.

10. The method of claim 7, further comprising storing the required data into one of the line buffers if the cache unit is being read.

11. The method of claim 7, wherein each of the line buffers stores an effective flag configured to indicate whether data in a corresponding line buffer of the line buffers is readable.

\* \* \* \* \*